(12) United States Patent
Clark et al.

(10) Patent No.: US 7,901,490 B2
(45) Date of Patent: Mar. 8, 2011

(54) REDUCING INTRODUCTION OF FOREIGN MATERIAL TO WAFERS

(75) Inventors: David J. Clark, Poughkeepsie, NY (US); Alison K. Easton, New Paltz, NY (US); James E. Fluegel, Rhinbeck, NY (US); James H. Peterman, Milford, CT (US)

(73) Assignee: International Business Machines Corporation, Armonk, NY (US)

( * ) Notice: Subject to any disclaimer, the term of this patent is extended or adjusted under 35 U.S.C. 154(b) by 423 days.

(21) Appl. No.: 11/972,118

(22) Filed: Jan. 10, 2008

(65) Prior Publication Data

US 2009/0180848 A1  Jul. 16, 2009

(51) Int. Cl.
*C23C 16/00* (2006.01)

(52) U.S. Cl. ............... 96/98; 55/385.1; 96/99; 206/710; 206/832; 361/225

(58) Field of Classification Search ............ 55/385.6, 55/DIG. 39, 385.1, 385.2; 454/184, 192; 428/345, 343, 922; 438/459; 156/247, 281, 156/154, 152; 43/114, 115, 119; 96/98, 96/99; 414/935–941; 361/225–235; 206/710, 206/711, 712, 832
See application file for complete search history.

(56) References Cited

U.S. PATENT DOCUMENTS

| 5,484,472 | A | * | 1/1996 | Weinberg | 96/26 |
| 5,902,678 | A | * | 5/1999 | Konda et al. | 428/345 |
| 6,159,827 | A | * | 12/2000 | Kataoka et al. | 438/464 |
| 6,320,269 | B1 | * | 11/2001 | Chen et al. | 257/787 |
| 6,322,633 | B1 | | 11/2001 | Bexten et al. | |
| 6,508,982 | B1 | * | 1/2003 | Shoji | 422/22 |
| 6,697,152 | B2 | * | 2/2004 | Batchelder | 356/237.1 |
| 6,875,282 | B2 | * | 4/2005 | Tanaka et al. | 118/719 |
| 6,998,133 | B2 | * | 2/2006 | Simpson | 424/409 |
| 7,065,898 | B2 | | 6/2006 | Kim et al. | |
| 7,258,730 | B2 | * | 8/2007 | Choi et al. | 96/69 |
| 7,325,698 | B2 | * | 2/2008 | Halbmaier | 220/326 |
| 7,594,959 | B2 | * | 9/2009 | Nutsos | 96/69 |
| 2004/0187377 | A1 | * | 9/2004 | Gardner, Jr. | 43/114 |
| 2004/0216367 | A1 | * | 11/2004 | Klein | 43/114 |
| 2007/0051237 | A1 | * | 3/2007 | Furukawa et al. | 95/59 |
| 2007/0054115 | A1 | * | 3/2007 | Codding et al. | 428/343 |
| 2007/0068066 | A1 | * | 3/2007 | Reatti | 43/114 |
| 2010/0011655 | A1 | * | 1/2010 | Frisch | 43/114 |
| 2010/0071254 | A1 | * | 3/2010 | Calkins et al. | 43/107 |

* cited by examiner

*Primary Examiner* — Duane Smith
*Assistant Examiner* — Minh-Chau Pham
(74) *Attorney, Agent, or Firm* — Ian Mackinnon; Roberts Mlotkowski Safran & Cole, P.C.

(57) ABSTRACT

A system and method of reducing the introduction of foreign material to wafers. A system includes an enclosure structured and arranged to carry wafers used in semiconductor device manufacturing, and an attractive material arranged as at least a portion of an interior surface of the enclosure.

20 Claims, 5 Drawing Sheets

REDUCING INTRODUCTION OF FOREIGN MATERIAL TO WAFERS

FIELD OF THE INVENTION

The invention generally relates to the manufacturing and processing of semiconductor devices, and, more particularly, to systems and methods for reducing the contamination of semiconductor devices during the manufacturing and processing of such devices.

BACKGROUND OF THE INVENTION

During the manufacture of semiconductor devices, components are typically transported through various processing points in carrying devices. For example, during the manufacture of 300 mm wafers, the wafers may be transported through the manufacturing line in a Front Opening Unified Pod (FOUP). Conventional FOUPs typically comprise a box-like structure that can carry a number of wafers (for example, twenty five) inside the box-like structure. The FOUP generally comprises a removable door for allowing access to the interior of the box-like structure and any wafers accommodated therein. The FOUP also typically includes locating features (for example, recesses in a bottom surface of the box-like structure) that are structured and arranged to engage with coupling pins located at the various processing points where the FOUP is to be opened for access to the wafers therein.

It is well understood that foreign material (for example, dirt and other contaminants) interferes with microscopic semiconductor devices. Accordingly, great effort is taken to reduce the amount of foreign material that interferes with the microscopic devices that are being built on the wafers carried in FOUPs. However, repeated opening and closing of a FOUP disadvantageously allows foreign material to collect on the microscopic devices on the wafers, thereby reducing wafer yield.

One method of combating the presence of foreign material is to routinely unload and clean the FOUPs. For example, at predetermined time intervals, each FOUP may be unloaded of any wafers and subjected to a cleaning that involves the use of jets of hot, de-ionized water, exposure to radiation, spin drying, etc. In this manner, foreign material that may have accumulated on the walls of the FOUP may be removed so that it does not become re-deposited on wafers inside the FOUP. However, routine cleaning only partly addresses the problem of contamination, and any foreign material that accumulates on the walls of a FOUP in between cleanings is free to re-deposited on wafers inside the FOUP.

Accordingly, there exists a need in the art to overcome the deficiencies and limitations described hereinabove.

SUMMARY OF THE INVENTION

In a first aspect of the invention, there is a system comprising an enclosure structured and arranged to carry wafers used in semiconductor device manufacturing. The system further includes an attractive material comprising at least a portion of an interior surface of the enclosure.

In another aspect of the invention, there is a front opening unified pod (FOUP) comprising a shell having an interior surface, and at least one battery operatively connected to the shell that applies an electrostatic charge to at least one portion of the shell.

In another aspect of the invention, there is a method of reducing contamination to wafers carried in a front opening unified pod (FOUP). The method includes activating an attractive material at an interior of the FOUP, and carrying wafers in the FOUP during manufacturing processes.

DETAILED DESCRIPTION OF EMBODIMENTS OF THE INVENTION

The invention generally relates to the manufacturing and processing of semiconductor devices, and, more particularly, to systems and methods for reducing the contamination of semiconductor devices during the manufacturing and processing of such devices. In implementations of the invention, a surface that attracts and holds foreign material is provided on the interior of a FOUP. In this manner, any foreign material that finds it way inside the FOUP is attracted to and held on the surface, and does not contaminate the semiconductor devices being built on the wafers held inside the FOUP. Accordingly, contamination is reduced, which leads to an increase in wafer yield.

Figure 1:
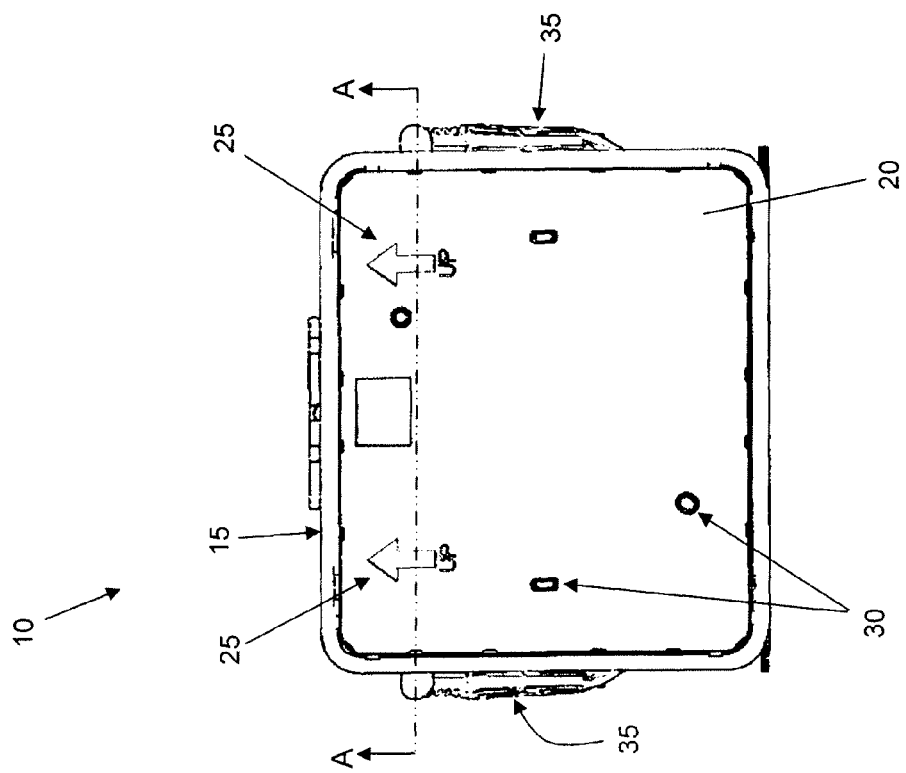
FIG. 1 shows a front view of a system according to aspects of the invention.

FIG. 1 shows a front view of a system according to aspects of the invention. The system comprises an enclosure 10 that is structured and arranged to hold semiconductor devices during the processing and/or manufacturing of the semiconductor devices. For example, the enclosure 10 may comprise a Front Opening Unified Pod (FOUP) that is designed to accommodate up to twenty five 300 mm wafers. However, the invention is not limited to use with a FOUP that holds twenty five 300 mm wafers, and any enclosure sized and arranged to accommodate any suitable number of any suitable size of wafers may be used within the scope of the invention.

In embodiments, the enclosure 10 comprises a hollow shell 15 and a door 20, which is selectively removable from the shell 15 to allow access to the interior of the shell 15. The shell 15 and door 20 may be made of any suitable material, such as, for example, polyetherimide (PEI), polycarbonate, plastics, etc. As depicted in FIG. 1, the door 20 may comprise indicia 25 indicating a proper orientation of the enclosure 10. Additionally, the door 20 may comprise locating elements 30, such as, for example, recesses, pins, and/or alignment marks, which are provided for precisely aligning the enclosure 10 at stations in a manufacturing line, as is known in the art. Moreover, as further depicted in FIG. 1, the enclosure 10 may comprise handles 35 for manual and/or automated (e.g., robotic) carrying of the enclosure 10.

Figure 2:
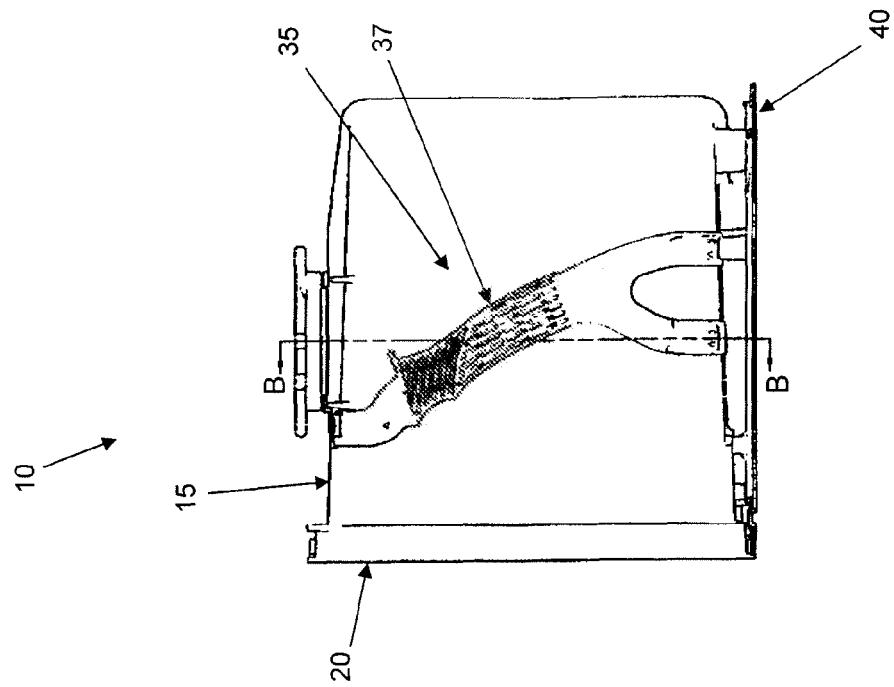
FIG. 2 shows a side view of a system according to aspects of the invention.

FIG. 2 shows a side view of the enclosure 10. In embodiments, the handles 35 include knurled portions 37 for enhanced gripping. Moreover, a base 40 may be provided at the bottom of the shell 15. Although not shown, the base 40 may include locating elements 30, such as, for example, recesses, pins, and/or alignment marks, similar to those described above with respect to the door 20.

Figure 3:
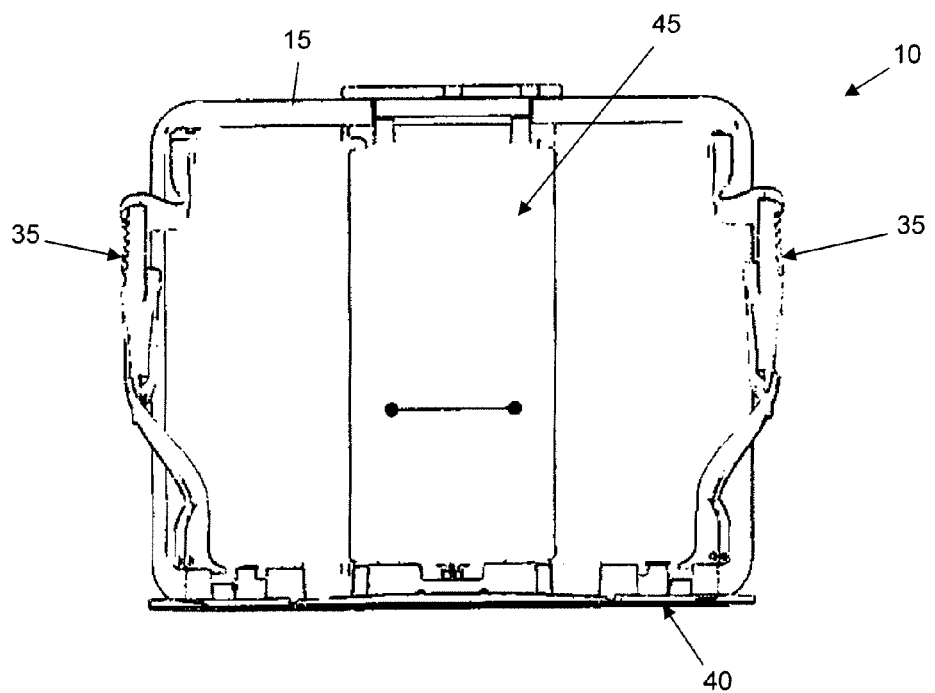
FIG. 3 shows a rear view of a system according to aspects of the invention.

FIG. 3 depicts a rear view of the enclosure 10, in which view the handles 35 and base 40 can be seen. Moreover, the enclosure 10 may comprise a back wall 45. In embodiments, the back wall 45 comprises a substantially planar surface that can be used for attaching identification material to the enclosure 10.

Figure 4:
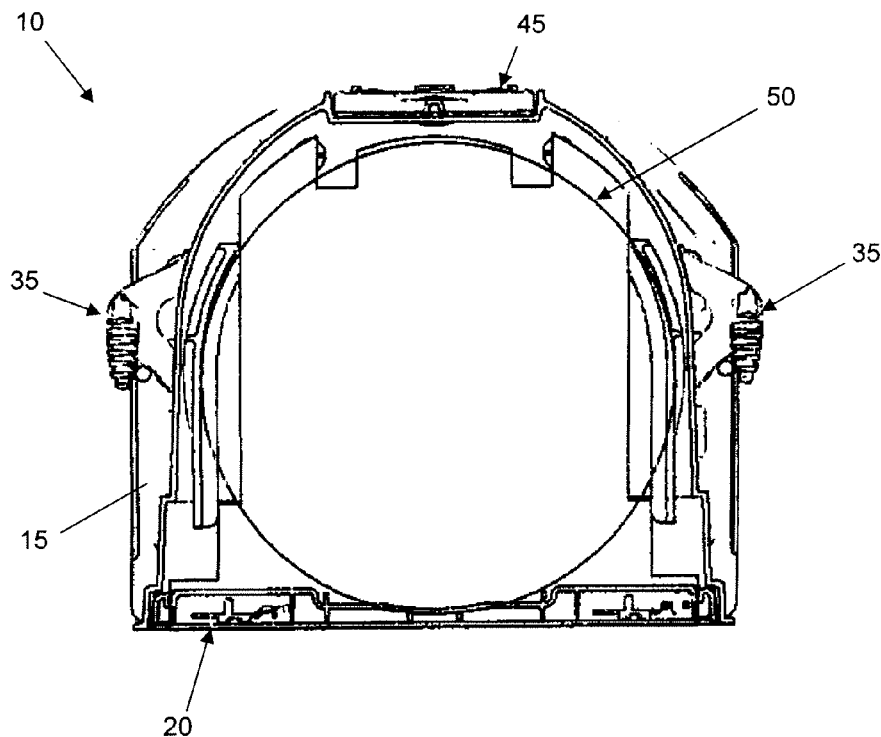
FIG. 4 shows a top, partially cutaway, view of a system according to aspects of the invention.

FIG. 4 shows a top view of the enclosure 10, taken along line A-A of FIG. 1. In embodiments, the shell 15 has substantially straight side walls that extend from the front of the shell 15 toward the back wall 45. The substantially straight side walls transition to curved walls that terminate at the back wall 45. However, it is noted that the invention is not limited to an enclosure of such shape; rather, the enclosure 10 may be provided with any suitable shape.

Still referring the FIG. 4, a wafer 50 is shown supported inside the enclosure 10. The wafer 50 may comprise, for example, a 300 mm wafer used in the manufacture of semiconductor devices. For example, microscopic semiconductor devices that are being built may be carried on the wafer 50. Although a 300 mm wafer is described, the invention is not limited to this size wafer, and any suitable wafer may be used with implementations of the invention.

In embodiments, the enclosure 10 is sized to accommodate twenty five wafers 50 spaced apart vertically within the interior of the shell 15. As such the enclosure 10 may have external dimensions of about twelve inches high, about fourteen inches wide, and about thirteen inches deep. It is noted, however, that the invention is not limited to these dimensions, and any suitably sized enclosure may be used to house any suitable number of wafers therein.

Figure 5:
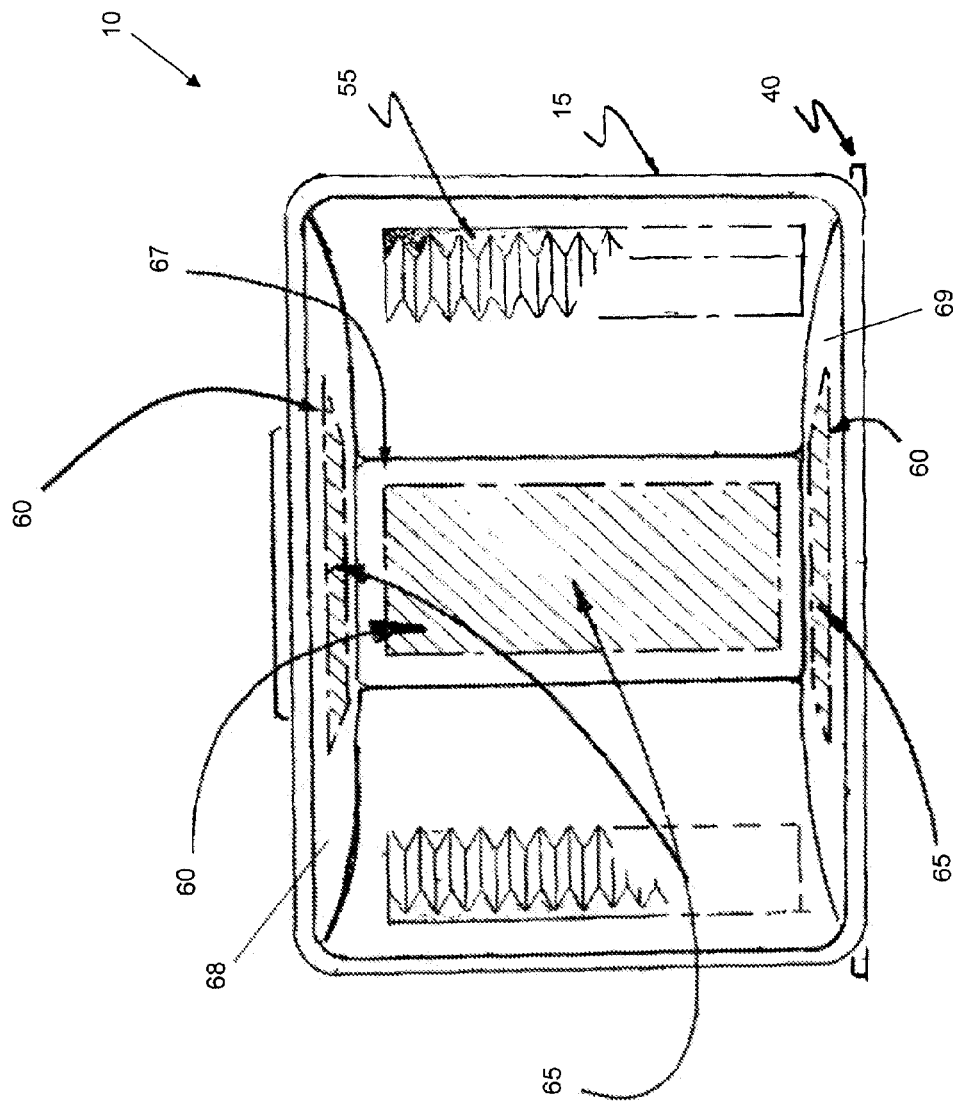
FIG. 5 shows a front interior view of a system according to aspects of the invention.

FIG. 5 shows an interior view of the shell 15 with the door (not shown) removed. In embodiments, the shell 15 includes wafer supports 55 for holding wafers in a stacked configuration. In embodiments, attractive material 60 is disposed at interior surfaces of the shell 15. As used herein, the term attractive material refers to a material that attracts foreign material (e.g., dirt and other contaminants) and holds the foreign material so that the foreign material does not fall onto any wafers in the enclosure 10.

In embodiments, the attractive material 60 comprises double-sided adhesive tape applied to interior surfaces of the shell 15. For example, at least one piece of double-sided tape may have a first adhesive surface applied to an interior surface of the shell 15, and a second adhesive surface 65 exposed within the interior of the shell 15. In this manner, the second adhesive surface 65 acts as an attractive material that attracts and holds foreign material (e.g., dirt).

Although three areas of attractive material 60 are shown in FIG. 5, any number of areas may be used with the invention. Moreover, the areas of attractive material 60 may be made of any suitable shape. For example, as depicted in FIG. 5, an area of attractive material 60 on the back interior wall 67 of the shell 15 may comprise a substantially rectangular piece of double-sided tape measuring about 5 inches by about 9 inches. Moreover, areas of attractive material 60 on the top interior wall 68 and bottom interior wall 69 of the shell 15 may comprise a substantially circular piece of double-sided tape measuring about 12 inches in diameter. The tape may be provided by a vendor in pre-cut pieces with appropriate shapes and dimensions, or the tape may be obtained in bulk and cut to shape according to the dimensions of the enclosure 10.

In implementations that utilize double-sided tape, the tape may have protective cover sheets that can be peeled away to expose the adhesive surfaces of the tape. In this manner, a first protective cover sheet may be peeled away to expose a first side of the tape, which is then adhered to an interior surface of the shell 15. Then the second protective cover sheet may be peeled away, exposing a second side of the tape that acts as the attractive material.

In further embodiments, at least the exposed side of the double-sided tape is non-outgasssing. That is to say, the double-sided tape does not emit molecules that act as contaminants to the wafers held in the shell 15. Additionally or alternatively, at least one side of the double-sided tape comprises a non-residue adhesive. That is to say, the tape does not leave a substantial residue on the interior of the shell when a piece of tape that is attached to the interior of the shell 15 is removed from the shell 15. By using non-residue tape, the pieces of tape may be removed and replaced periodically without leaving contaminants (e.g., residue) inside the shell 15.

Figure 6:
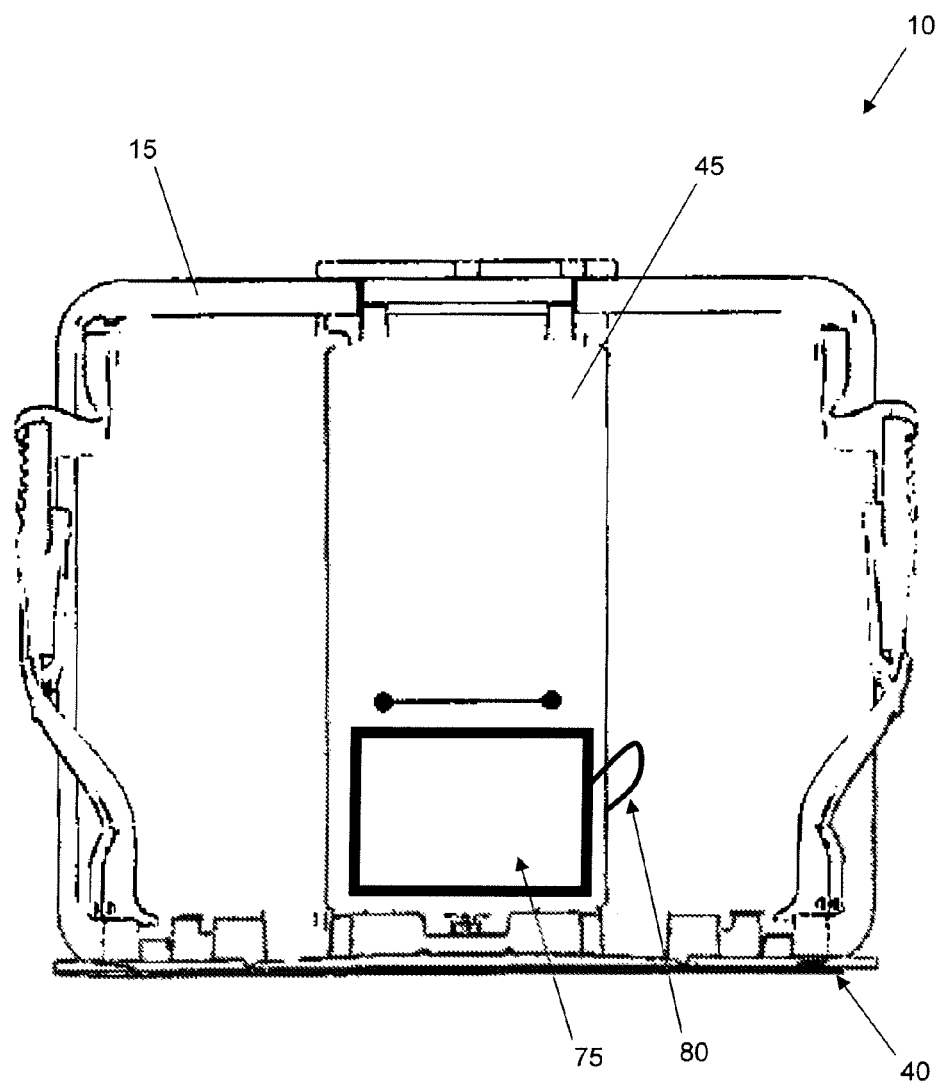
FIG. 6 shows a rear view of another system according to further aspects of the invention.

In further embodiments, and additionally or alternatively to using double sided tape, at least one portion of the shell 15 is provided with an electrostatic charge that acts to attract and hold foreign material to the interior surface of the shell 15. For example, as shown in FIG. 6, a battery pack 75 may be attached to the shell 15 and operatively connected to the shell (for example, by electrical lead 80) to provide an electrostatic charge to at least a portion of the shell 15. In an exemplary embodiment, the shell 15 comprises polyetherimide (PEI), and the battery pack 75 causes a charge of between about 10 volts and about 50 volts of electrostatic charge on interior surface portions of the PEI shell 15. In this manner, the interior surface portions of the shell 15 acts as an attractive material for attracting and holding contaminants. Other combinations of electrostatic charge voltage and shell material may be used.

The battery pack 75 may be rechargeable, and may be located at any suitable location on or in the shell 15. In implementations when an electrostatic charge is used, at least the wafer supports 55 should be insulated from the electrostatic charge, so that any wafers held in the enclosure 10 are not subjected to the electrostatic charge. This may be accomplished, for example, by constructing the wafer supports 55 from a different material than the shell 15.

Figure 7:
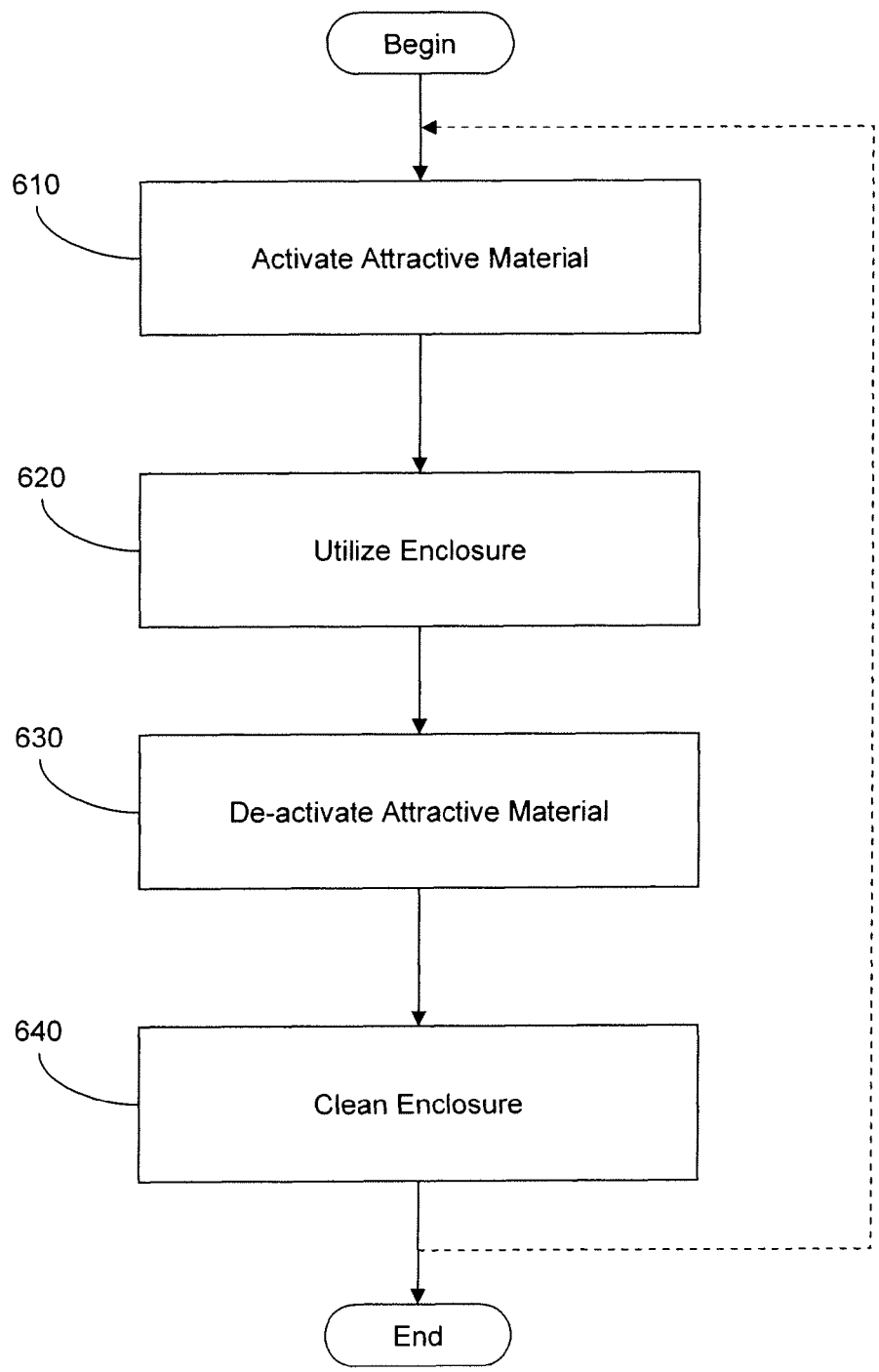
FIG. 7 shows a flow diagram depicting implementations of methods according to aspects of the invention.

FIG. 7 shows a process according to aspects of the invention. At step 610, attractive material is activated for an enclosure (such as, for example, the enclosure described above with respect to FIGS. 1-4). For example, when the attractive material comprises double-sided tape (such as that described above with respect to FIG. 5) step 610 may comprise peeling a first protective cover sheet away from a first surface of the tape, adhering the tape to an interior surface of the enclosure, and peeling a second protective cover sheet from the tape to expose a second adhesive surface of the tape.

In embodiments where an electrostatic charge is used, step 610 may comprise, for example, operatively connecting a battery pack (such as that described above with respect to FIG. 6) to the enclosure such that an electrostatic charge is provided on at least one portion of the enclosure.

At step 620, the enclosure is used in manufacturing processes while the activated attractive material attracts and holds contaminants. For example, the enclosure may comprise a FOUP that is used to carry 300 mm wafers in a semiconductor device manufacturing process. Step 620 may comprise, for example, using the FOUP for a predetermined number of processing steps.

At step 630, the attractive material is deactivated. In embodiments where double-sided tape is used, this may comprise removing all of the wafers from the FOUP, and then removing the tape from the interior walls of the shell. In embodiments where an electrostatic charge is utilized, this may comprise removing all of the wafers from the FOUP, and then disconnecting the battery pack from the shell to eliminate the electrostatic charge from the shell.

At step 640, the enclosure is cleaned. This may comprise, for example, subjecting the FOUP to a cleaning that involves the use of jets of hot, de-ionized water, exposure to radiation, spin drying, etc. If the enclosure is to be used again, then the process returns to step 610; otherwise, the process ends.

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in terms of embodiments, those skilled in the art will recognize that the invention can be practiced with modifications and in the spirit and scope of the appended claims.

What is claimed:

1. A system, comprising:
   an enclosure structured and arranged to carry wafers used in semiconductor device manufacturing, wherein the enclosure comprises a front opening unified pod (FOUP) having a shell composed of polyetherimide (PEI) and a removable front door;
   an attractive material comprising a double-sided adhesive tape adhered to an interior surface of the shell; and
   at least one battery operatively connected to an interior portion of the shell, wherein the at least one battery applies an electrostatic charge to the interior portion of the shell,
   wherein the charge has a magnitude of between about 10 volts and 50 volts of electrostatic charge.

2. The system of claim 1, wherein the attractive material comprises a material that attracts and holds contaminants.

3. The system of claim 1, wherein the double-sided adhesive tape comprises a first adhesive side and a second adhesive side opposite the first adhesive side.

4. The system of claim 3, wherein the first adhesive side is adhered to the interior surface of the enclosure.

5. The system of claim 4, wherein the first adhesive side comprises a non-residue adhesive.

6. The system of claim 4, wherein the second adhesive side comprises a non-outgassing adhesive.

7. The system of claim 1, wherein:
   the double-sided adhesive tape comprises a first adhesive side applied to the interior surface of the enclosure;
   the double-sided adhesive tape comprises a second adhesive side, opposite the first adhesive side, that attracts and holds contaminants so that the contaminants do not fall onto the wafers in the FOUP;
   the first adhesive side comprises a non-residue adhesive; and
   the second adhesive side comprises a non-outgassing adhesive.

8. The system of claim 7, wherein:
   the double-sided adhesive tape comprises plural separate pieces;
   a first piece of the double-sided adhesive tape is adhered to a back interior wall of the shell of the FOUP;
   a second piece of the double-sided adhesive tape is adhered to a bottom interior wall of the shell of the FOUP;
   a third piece of the double-sided adhesive tape is adhered to a top interior wall of the shell of the FOUP;
   the second piece of the double sided tape is larger in area than the first piece of the double-sided adhesive tape; and
   the third piece of the double sided tape is larger in area than the first piece of the double-sided adhesive tape.

9. The system of claim 1, wherein:
   the electrostatic charge attracts and holds foreign material to the interior portion of the shell;
   the at least one battery comprises a rechargeable battery pack; and
   the at least one battery is operatively connected to the shell by an electrical lead.

10. A front opening unified pod (FOUP), comprising:
    a shell having an interior surface; and
    at least one battery operatively connected to the shell that applies an electrostatic charge to at least one portion of the shell.

11. The front opening unified pod (FOUP) of claim 10, wherein the at least one battery comprises a rechargeable battery pack.

12. The front opening unified pod (FOUP) of claim 10, wherein the at least one portion of the shell comprises the interior surface of the shell.

13. The front opening unified pod (FOUP) of claim 12, wherein:
    the shell comprises at least one wafer support structured and arranged to hold a 300 mm wafer inside the shell, and
    the at least one wafer support is insulated from the electrostatic charge.

14. The front opening unified pod (FOUP) of claim 12, wherein the charge has a magnitude of between about 10 volts and 50 volts of electrostatic charge.

15. The front opening unified pod (FOUP) of claim 12, wherein the shell is composed of polyetherimide (PEI) and includes a removable front door.

16. The front opening unified pod (FOUP) of claim 10, wherein:
    the shell is composed of polyetherimide (PEI) and includes a removable front door; and
    the charge has a magnitude of between about 10 volts and 50 volts of electrostatic charge.

17. A method of reducing contamination to wafers carried in a front opening unified pod (FOUP), comprising:
    activating an attractive material at an interior of the FOUP; and
    carrying wafers in the FOUP during manufacturing processes,
    wherein the activating the attractive material comprises at least one of:
      applying at least one piece of double-sided tape to an interior surface of the FOUP, and
      applying an electrostatic charge to at least one interior surface of the FOUP using a battery, wherein the FOUP comprises a shell composed of polymer material and a removable front door, at least one battery is operatively connected to an interior portion of the shell, and the at least one battery applies an electrostatic charge to the interior portion of the shell.

18. The method of claim 17, further comprising:
deactivating the attractive material; and
cleaning the FOUP.

19. The method of claim 17, wherein:
the at least one piece of double sided tape comprises: a first adhesive side comprising a non-residue adhesive applied to the interior surface of the enclosure, and a second adhesive side comprising a non-outgassing adhesive that attracts and holds contaminants so that the contaminants do not fall onto the wafers in the FOUP; and
the applying the electrostatic charge comprises connecting the battery to a shell of the FOUP using an electrical lead such that a charge having a magnitude of between about 10 volts and 50 volts of electrostatic charge is created at the at least one interior surface of the FOUP.

20. The method of claim 17, wherein:

the shell is composed of polyetherimide (PEI); and the charge has a magnitude of between about 10 volts and 50 volts of electrostatic charge.

\* \* \* \* \*